United States Patent [19]

Saho et al.

[11] Patent Number: 4,959,964
[45] Date of Patent: Oct. 2, 1990

[54] CRYOSTAT WITH REFRIGERATOR CONTAINING SUPERCONDUCTIVE MAGNET

[75] Inventors: Norihide Saho; Takeo Nemoto; Hisanao Ogata, all of Ibaraki; Mitsuru Saeki, Hitachi, all of Japan

[73] Assignee: Hitachi, Ltd., Tokyo, Japan

[21] Appl. No.: 406,235

[22] Filed: Sep. 12, 1989

[30] Foreign Application Priority Data

Sep. 16, 1988 [JP] Japan .................. 63-230009
Feb. 20, 1989 [JP] Japan .................... 1-38223

[51] Int. Cl.$^5$ ............................................. F25B 19/02
[52] U.S. Cl. .................................... 62/51.1; 250/352
[58] Field of Search ................. 62/467, 51.1; 250/352

[56] References Cited

U.S. PATENT DOCUMENTS

| | | | |
|---|---|---|---|
| 4,394,819 | 7/1983 | Averill | 62/51.1 |
| 4,509,342 | 4/1985 | Van Antwerpen | 62/51.1 |
| 4,510,771 | 4/1985 | Matsuda et al. | 62/51.1 |
| 4,535,595 | 8/1985 | Keller et al. | 62/467 |
| 4,672,202 | 6/1987 | Crossley, Jr. et al. | 62/51.1 |
| 4,689,970 | 9/1987 | Ohguma et al. | 62/51.1 |
| 4,777,807 | 10/1988 | White | 62/51.1 |
| 4,848,103 | 7/1989 | Pelc et al. | 62/45.1 |

Primary Examiner—Ronald C. Capossela
Attorney, Agent, or Firm—Antonelli, Terry, Stout & Kraus

[57] ABSTRACT

In a cryostat with a refrigerator containing a superconductive magnet, in which a material to be cooled and a low temperature end of the refrigerator for cooling the to-be-cooled material are disposed within a heat-insulating tank, the refrigerator is connected in unison with a part of a structural member other than the heat-insulating tank by a rigid coupling member. Accordingly, a heat portion of the refrigerator is tightly coupled to a magnetic shield member having a large mass and is connected to a vacuum container through bellows. The end portion of the refrigerator is formed in unison with heat shield sleeves and/or the heat shield tank through heat-conductive material having elasticity. Also, in order to prevent the leakage of the sound or noise from the heat portion, a sound-insulating cover is provided also for passages connecting to the head portion and is fixed to the magnetic shield member.

15 Claims, 4 Drawing Sheets

FIG. I

CRYOSTAT WITH REFRIGERATOR CONTAINING SUPERCONDUCTIVE MAGNET

BACKGROUND OF THE INVENTION

The present invention relates to a cryostat with a refrigerator containing a superconductive magnet, and more particularly, to a cryostat with a refrigerator for use in a nuclear magnetic resonant imaging apparatus, which cryostat is small in size and may operate with a reduced noise, while having the refrigerator that produces vibration.

DESCRIPTION OF THE PRIOR ART

In a conventional cryostat with a refrigerator, in particular in a nuclear magnetic resonant instrument (MRI) for inspecting a living body, used in a medical field as described in Japanese Patent Unexamined Publication No. 63-51849, a superconductive magnet (hereinafter referred to as a magnet) is used for obtaining a uniform high magnetic field. It is therefore necessary to provide a cryostat thermally insulated under the vacuum condition for receiving and cooling the magnet. In order to keep the superconductive condition constant, the magnet is dipped into an extremely low temperature cooling medium, for example, liquefied helium to be cooled down. Since the liquefied helium is gradually evaporated due to the heat that has entered into the cryostat from a vacuum container kept at room temperature for the cryostat, it is necessary to periodically replenish liquefied helium. If the evaporation amount of liquefied helium is reduced, the consumption amount of liquefied helium is reduced, resulting in remarkable reduction in running cost. For this reason, a refrigerator or the like is provided in the cryostat to absorb the heat, introduced from the vacuum container, by the cooling ability of the refrigerator, thereby reducing the evaporation amount of liquefied helium. Since, in general, the refrigerator is of the expansion type such as a reciprocating type, there are drive noises and collision noises of a piston during the operation, which noises will be transmitted to the vacuum container of the cryostat, thereby allowing the noise level to be increased.

In order to cope with this noise problem, a tip end of the refrigerator is fixed to a heat shield tank or heat shield cylinder within the cryostat, and a head portion of the refrigerator is formed in unison with the vacuum container through a air-tight bellows. In addition, the refrigerator head that is a source of drive noise is surrounded by a noise shielding cover which is fixed to the vacuum container.

In such an arrangement, the gravitational weight of the refrigerator and the vacuum pressure load are supported by the heat shield tank or heat shield cylinder through heat conductive rigid material. Accordingly, it is necessary to increase the rigidity of the tank or cylinder by increasing a thickness of the tank or cylinder per se and to increase the rigidity of the support member for the tank or cylinder. However, since the support member is fixed at one end to the wall of the vacuum container, if the rigidity is increased, the vibration of the refrigerator is transmitted to the vacuum container. The conventional arrangement suffers from such a problem and other problems by which it is impossible to reduce the noises and the weight of the cryostat is increased. Where the heat conductive material interposed between the refrigerator and the heat shield tank or cylinder causes the condition which shows the beheavior of elastic support due to the aging change, a part of the load is supported by the bellows. In this case, the conventional arrangement suffers from a problem in which the vibration is transmitted to the vacuum container through the bellows to generate noises and another problem in which repeated shifts are applied to the heat conductive member and the bellows to generate a fatigue fracture to degrade the reliability of the cryostat. Also, with respect to the noise shielding for the head of the refrigerator, in the conventional arrangement, there is no countermeasure against the gas flow noise transmitted through gas pipes connected to the refrigerator for the supply/discharge gas. It is impossible to reduce the noises generating in the flowing gas.

Also, in a superconductive magnetic apparatus as disclosed in Japanese Patent Unexamined Publication No. 63-164205, a refrigerator is mounted outside of a vacuum container in a central portion in the axial direction of the superconductive coil.

In such a superconductive magnetic apparatus, since the refrigerator is mounted on an upper portion of the vacuum container or mounted directly onto the vacuum container even in other locations, this apparatus also suffers from the problems in noise levels and, mounting strength as in the foregoing prior art.

SUMMARY OF THE INVENTION

Accordingly, an object of the invention is to provide a cryostat with a refrigerator containing a superconductive magnet, in which a vibration-proof structure is applied to the refrigerator to reduce noises, and to provide high operational reliability and be small in size and weight.

In order to attain the above and other objects, in a cryostat with a refrigerator according to the invention, a head portion of the refrigerator is tightly coupled to a magnetic shield member having a large mass and is connected to a vacuum container through bellows, with a tip end of the refrigerator being formed in unison with a heat shield tank and/or heat shield cylinders through a heat-conductive material having elasticity. In order to prevent the leakage of the noises from the head portion, a sound-insulating cover is provided also for the passages connected to the head portion and is fixed to the tightly coupled magnetic shield member.

In a cryostat with a refrigerator according to the invention, the material to be cooled and the low temperature end of the refrigerator for cooling the to-be-cooled material are received in a heat-insulating tank. The refrigerator is coupled to a part of the structural member other than the heat-insulating tank by a rigid coupling means.

Preferably, it the refrigerator and the heat insulating tank outer wall are coupled to each other through an elastic support means. Advantageously, a sound-insulating means is provided for covering a part of the refrigerator outside the heat insulating tank, and the sound-insulating means is coupled to the structural member and/or the vacuum container. In this case, it is preferable to cover the passages connected to the refrigerator with a sound-insulating means, and to temporarily couple the refrigerator and the outer wall of the heat insulating tank by detachably rigid coupling means.

In the foregoing arrangement, the vibration generated by the refrigerator fixedly secured to the cryostat is absorbed to the magnetic shield member having a weight of several tons and small characteristic frequency so that almost no vibration is transmitted to the vacuum container connected through the bellows. Thus, it is possible to reduce noises resonant with the vacuum container. Also, since the head portion of the refrigerator including the connected gas pipes may be covered by the sound insulating cover and may be fixed to the magnetic shield member, it is possible to reduce noises due to the gas flow through the head portion of the refrigerator. On the other hand, the weight of the refrigerator and the vacuum pressure load may be sufficiently supported by the rigid magnetic shield member, so that there is no dynamic and static change in the refrigerator. Thus, there are no vibrating parts in the cryostat. The reliability thereof is enhanced, and simultaneously therewith, the plate thickness of the heat shield tank and the heat shield cylinders may be decreased to reduce the weight of the cryostat as a whole.

In accordance with another aspect of the invention, a shaft of a cooling medium generating portion of a compact helium refrigerator is mounted in a central portion in an axial direction of a cylindrical superconductive coil and at an angle of 45 degrees in a radial direction relative to a horizontal surface on an outer peripheral surface of a vacuum container of a hollow cylinder type.

With this arrangement, the superconductive magnet used in a nuclear magnetic resonant imaging apparatus is in the form of a cylinder. On the other hand, a hospital room or the like in which the apparatus is installed is generally in the form of a parallelepiped therefore, when the cylindrical superconductive magnet is received in the room, a free space is obliquely provided from above an upper surface of the vacuum container of the superconductive magnet as defined by an angle of 45 degrees. According to the invention, since this space is utilized for the refrigerator, it is possible to mount the refrigerator in place without changing a height or a width of the superconductive magnet, and the minimum possible size is attained for the cylindrical superconductive magnet. Also, since the refrigerator is provided in a space defined downwardly by the angle 45 degrees relative to the superconductive magnet, it is easy to perform the mounting/dismounting operation of the refrigerator in comparison with the conventional case where the refrigerator is mounted on an upper portion of the superconductive magnet.

DETAILED DESCRIPTION OF THE PREFERRED EMBODIMENTS

Figure 1:
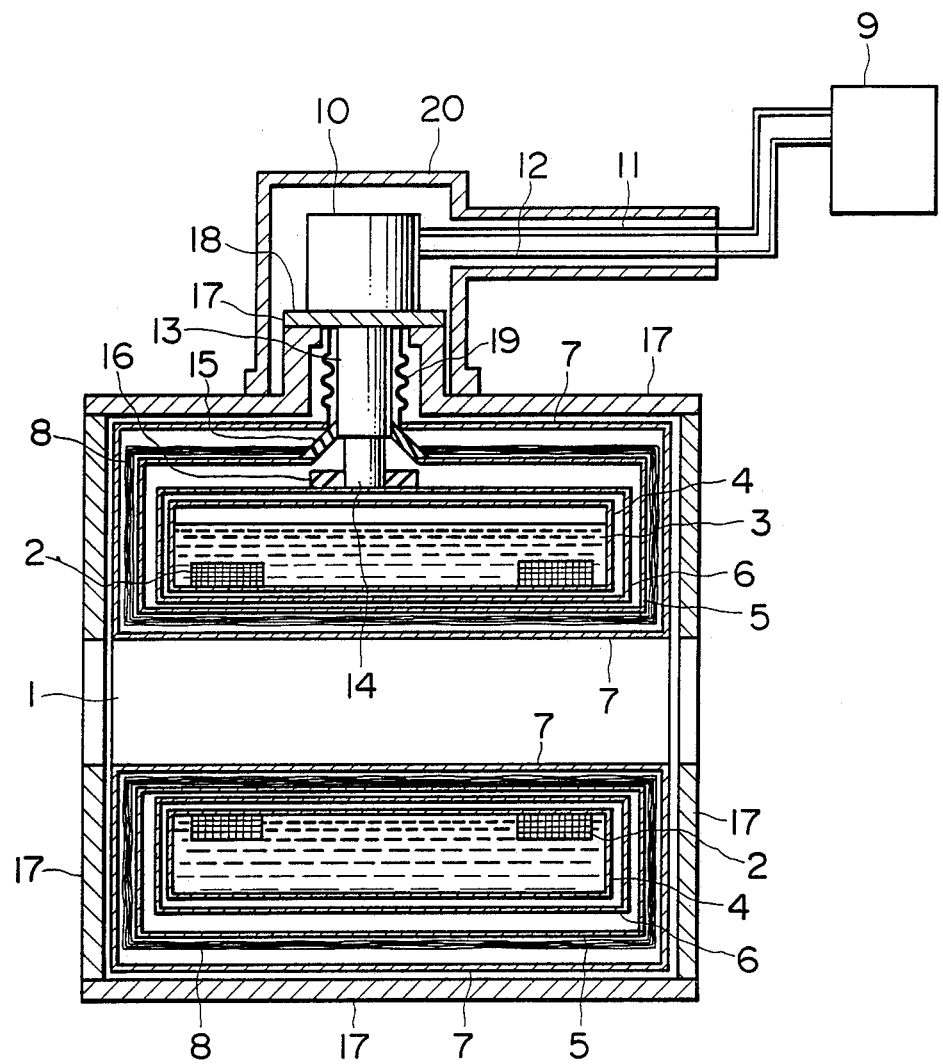
FIG. 1 is a cross-sectional view showing a cryostat with a refrigerator containing a superconductive magnet in accordance with one embodiment of the invention.

Referring now to the drawings wherein like reference numerals are used throughout the various views to designate like parts and, more particularly, to FIG. 1, according to this figure, a cryostat in accordance with the present invention has, in a central portion thereof, a cavity 1 which is in communication with the atmosphere and into which a material to be inspected is inserted. The cryostat contains therein a liquefied helium 3 for reserving a superconductive magnet 2 to be cooled, a liquefied helium tank 4 for accommodating the liquified helium, and heat shield sleeves 5 and 6 which are of other material to be cooled at a plurality of temperature levels (about 70K and about 15K in the embodiment). An interior of the cryostat is insulated from the atmosphere by vacuum containers 7 and is vacuum-insulated by an insulation treatment, i.e. winding a laminated insulator 8 thereon. A refrigerator such as a Solbey type refrigerator is composed of a compressor unit 9 for a gas pressurizing source, a piston reciprocation type expander 10, i.e., a refrigerator unit, and high and low pressure passages 11 and 12 for communicating the compressor unit 9 and the refrigerator unit 10 with each other. A low temperature part of the expander is inserted into the cryostat. A first stage 13 cooled at a temperature of about 70K and a second stage 14 cooled at a temperature of about 15K are formed in unison with the heat shield sleeves 5 and 6, respectively, through elastic heat-conductive members 15 and 16.

A magnetic member, i.e., a ferric magnetic shield member 17 that is a structural member other than the insulating tank is provided on the outer side of the cryostat for retaining the leaked magnetic field within the small space. A thickness of the magnetic shield member 17 is 50 mm or more and its weight is several tons. The expander 10 is completely coupled to the magnetic shield member 17 through a flange 18 by rigid coupling means such as bolts. The expander 10 is formed integrally with the vacuum container 7 through bellows 19 and the flange 18.

A noise-insulating cover 20 inside of which is lined with sound-absorption material is used to cover a head portion of the expander 10 and the passages 11 and 12. The noise-insulating cover 20 is fixed to the magnetic shield member 17.

Since the vibration of the expander 10 is absorbed through the flange 18 into the magnetic shield member or plate 17 which is at least 100 times larger than the expander in mass or weight, almost no vibration is transmitted to the vacuum container 7 connected through the bellows 19 which is the elastic support member. Accordingly, there is no noise resonance with the vacuum container. Thus, the noise is considerably reduced.

Also, since the noise generated by the expander itself is absorbed into the noise-insulating cover that surrounds the head portion of the expander 10 as well as the passages 11 and 12, almost no noise leaks to the outside. Thus, the noise of the expander 10 is considerably reduced. On the other hand, since the gravitational weight of the expander 10 and the vacuum pressure load are supported by the rigid magnetic shield member 17 through the flange 18, the position of the expander 10 is almost not shifted even if these loads are applied to the expander 10. Therefore, since there is almost no part that is vibrated during the operation of the expander 10, any fatigue fracture or the like will not be generated.

Thus, it is possible to provide a highly reliable cryostat which is free from problems in which vacuum is leaked through cracks formed in the bellows 19, and the cooling performance is reduced through cranks formed in the elastic heat-insulator, resulting in increase of the temperature in the heat shield sleeve. Also, the heat shield sleeve is not necessarily the support member for the expander 10. The heat shield sleeve may be made of an aluminum plate having a thickness of about one mm. The heat shield tank and the sleeves may be made light in weight. Also, it is possible to increase the cooling rate.

According to the foregoing embodiment, it is possible to reduce a noise caused by the vibration of the refrigerator to enhance a reliability of the cryostat with the refrigerator and to make the heat shield tank and the sleeves light in weight.

Incidentally, although in the above described embodiment, the expander 10 and the vacuum container 7 are elastically connected to each other through the bellows 19, the two members may be coupled to each other through a thin circular sleeve since the vibration is absorbed by the magnetic shield member 17 to reduce the noise level.

Also, a double wall cylinder structure into which heat transfer medium, i.e., helium gas is filled may be applied to the expander 10 to ensure substantially the same advantages.

Figure 2:
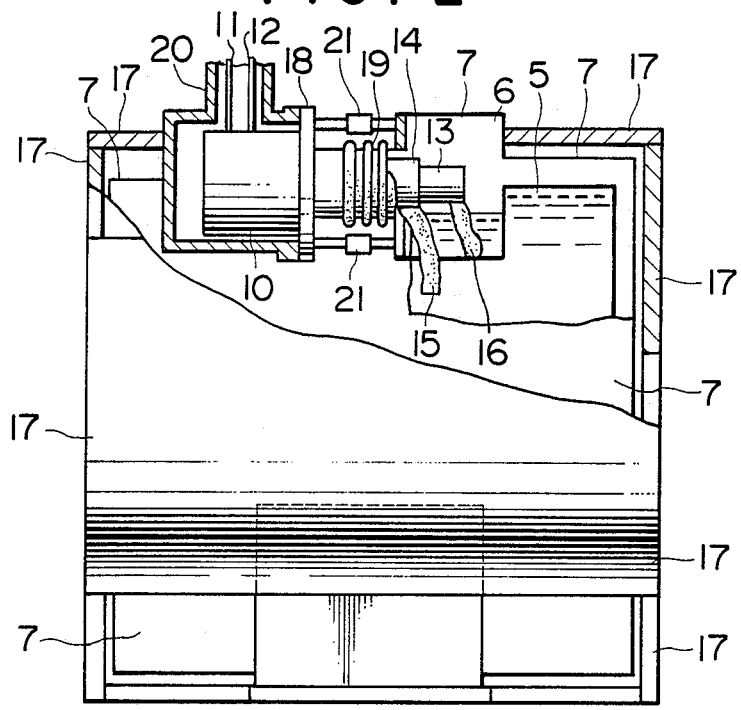
FIG. 2 is a cross-sectional of another embodiment of the invention.
Figure 3:
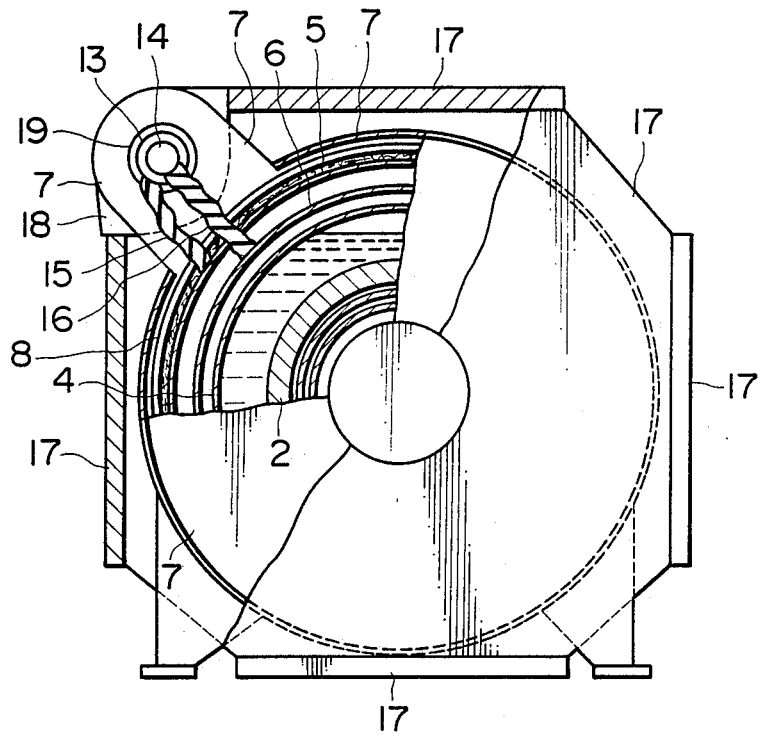
FIG. 3 is a partially fragmentary cross-sectional view of the apparatus shown in FIG. 2.
Figure 4:
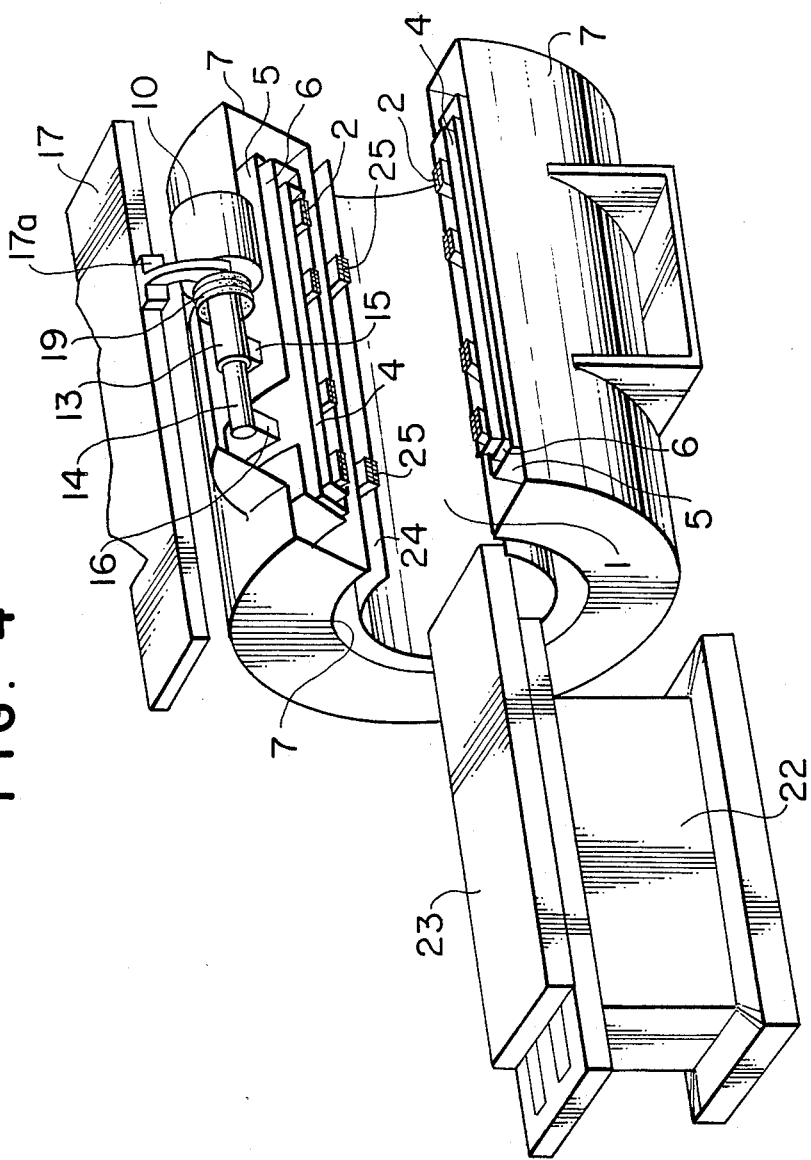
FIG. 4 is a perspective view showing the cryostat with the refrigerator from which a part has been removed for explanation.

As shown in FIGS. 2, 3 and 4, the expander 10 is horizontally disposed and for this reason, a flange 18 of the expander 10 is firmly fixed by rigid coupling means such as bolts or the like to a magnetic shield plate 17 having an octagonal cross section as is apparent from a cross-sectional view of FIG. 3. The expander 10 is located so as not to protrude from an upper magnetic shield plate 17 between side magnetic shields 17.

As shown most clearly in FIG. 2, a fixture support member 21 is detachable for positioning the expander 10 and for preventing the generation of vibration during transportation of the cryostat. An end portion of the flange 18 is connected to the vacuum container 7 until the flange 18 is firmly fixed to the magnetic shield plate 17. Thus, prior to mounting the expander 10 onto the magnetic shield 17, it is possible to readily perform the positioning of the expander 10. The magnetic shield plates 17 may be transported separately during the transportation of the cryostat.

In the MRI of FIG. 4, the structure of the cryostat is the same as that shown in FIGS. 2 and 3 but the arrangement of the expander 10 is the same as that shown in FIG. 3. The expander 10 is firmly coupled to the magnetic shield plate 17 by rigid coupling means supported to the magnetic shield plate 17, for example, by using a support arm 17a made of stainless steel. With such an arrangement, the operational vibration of the expander 10 is absorbed by the magnetic shield plate 17. It is possible to suppress the operational noise level within the range of 72 to 54 dB (A range). Also, in the MRI of FIG. 4, a slider 23 is slidable on a bed 22 together with a patient through the cavity 1. A nuclear magnetic resonant high frequency coil 25 is disposed within the cavity 1.

As has been described above, since the expander 10 and the vacuum container 7 are elastically coupled through the bellows 19, and the gravitational weight of the expander 10 and the vacuum pressure load are supported to the rigid magnetic shield member or plate 17 having a large mass outside the cryostat, the vibration of the expander 10 is absorbed into the magnetic shield member 17 but is not transmitted to the vacuum container 7. Thus, it is possible to reduce the noise and to firmly fix the expander 10. There is no part that is vibrated during the operation, and the reliability of the cryostat is enhanced. Since the heat shield tank and the heat shield sleeves may be formed of a light material having a small thickness, a light-weight cryostat with a refrigerator is thereby provided.

Figure 5:
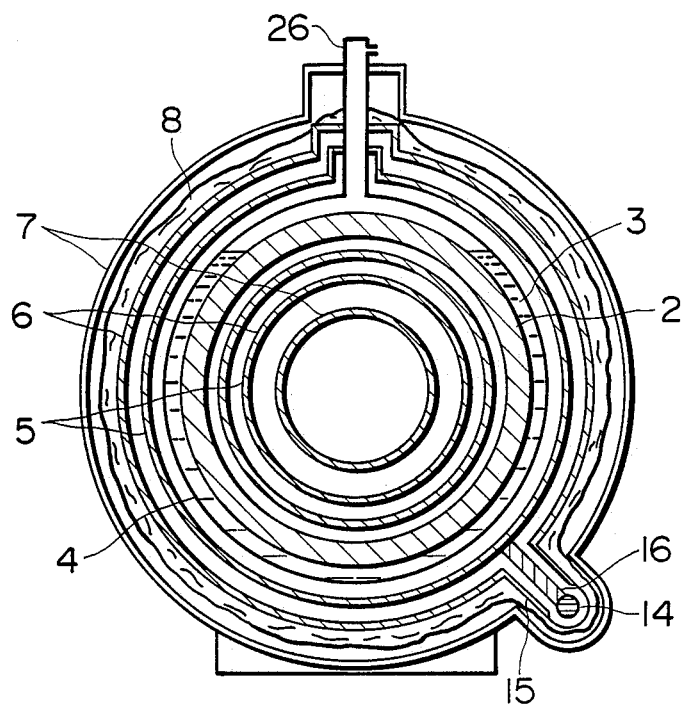
FIG. 5 is a cross-sectional view showing another embodiment of the invention.
Figure 6:
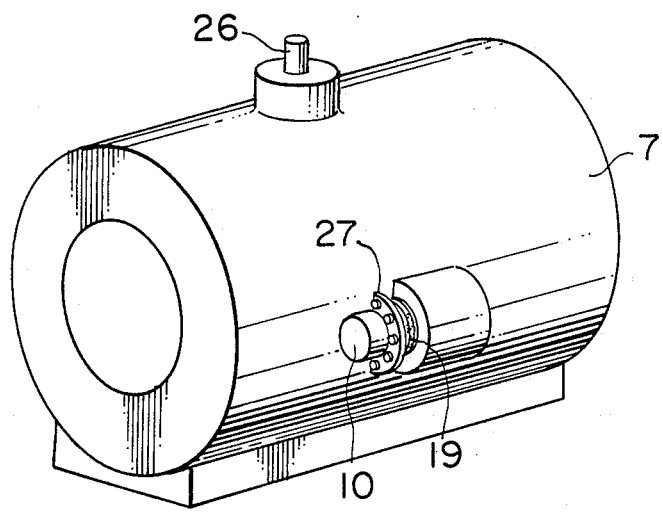
FIG. 6 is a perspective view of the cryostat shown in FIG. 5.

The cryostat of FIGS. 5 and 6 is the same as that of the foregoing embodiments except for the structure in which there is provided a service port 26 and the expander 10 is differently mounted. The service port 26 is used for supplying electric current for the superconductive coil 2 and for supplying the liquefied helium. Since the expander 10 constituting the refrigerator is mounted on the outer slant surface of the vacuum container 7 obliquely downwardly at an angle of 45 degrees. The axes of the first and second stages 14 of the refrigerator are arranged in parallel to the axis of the superconductive coil 2. With such an arrangement, the minimum possible size may be attained for a cryostat with the refrigerator including a cylindrical superconductive magnet. Since the refrigerator is thus located on the lower portion of the superconductive magnet, it is easy to perform the mounting/dismounting operation of the refrigerator in comparison with the case where the refrigerator is mounted on an upper portion of the superconductive magnet. In addition, since the apparatus is used in a hospital or the like, it is possible to eliminate the problem that an independent room must be built for the apparatus and the existing room must be modified which is generally required in the conventional large size superconductive magnet.

As is apparent from FIG. 6, the vacuum container 7 and the flange 27 of the refrigerator are fluid-tightly connected with each other through the bellows 12. Accordingly, the vibration generated in the expander 10 of the refrigerator is prevented from being transmitted to the vacuum container 7 and the expander 10 is connected to the magnetic shield member having a large mass or a small proper vibration frequency as shown in FIGS. 1 to 4. The ratio of the vibration to the transmitted through the magnetic shield body to the vacuum container 7 is further decreased.

In this case, in the refrigerator used in the nuclear magnetic resonant imaging apparatus, the cooling temperatures of the first and second stages 13, 14 of the two-stage cooling medium generator are 80K and 20K and are lower than those in the foregoing embodiment. This temperature difference is simply due to the use.

Also, the refrigerator is a compact helium refrigerator to which Gihord-McMahon cycle, Solbey cycle, Stirling cycle or the like is applied. In these refrigerators, a motor is arranged in a portion kept at room temperature.

In such a structure including a refrigerator with the superconductive magnet for the nuclear magnetic resonant apparatus, since the refrigerator is mounted by utilizing a space defined by an angle of 45 degrees obliquely downwardly of the cylindrical superconductive magnet, the provision of the refrigerator causes the size of the system to be kept unchanged in height and width. Accordingly, the minimum possible size is attained for the superconductive magnet with the refrigerator. Further, in the case where the refrigerator is mounted obliquely downwardly at an angle of 45 degrees around the superconductive magnet, it is easy to mount or dismount the refrigerator in comparison with the case where the refrigerator is mounted on an upper portion of the superconductive magnet.

What is claimed is:

1. A cryostat with refrigerator means including a low temperature end portion and containing superconductive magnet means, the cryostat comprising:
   a material to be cooled, the low temperature end portion of said refrigerator means being adapted to cool said material;
   a heat-insulating tank means for receiving said material and said low temperature end portion of the refrigerator means, said heat insulating tank accommodating at least one heat shielding sleeve means surrounded by an insulating means for insulating an interior of said cryostat and
   rigid coupling means for rigidly coupling said refrigerator means to a part of structural members disposed exteriorly of and covering said heat insulating tank means with a space between said heat-insulating tank means and said part of structural members.

2. The cryostat according to claim 1, wherein elastic support means couple said refrigerator means and an outer wall of said heat-insulating tank means to each other.

3. The cryostat according to claim 2, wherein detachably rigid coupling means are provided for temporarily coupling said refrigerator means and said outer wall of said heat-insulating tank.

4. The cryostat according to claim 1, further comprising sound-insulating means for covering a part of the refrigerator means extending outside of said heat insulating tank means, said sound-insulating means being connected to one of a vacuum container means and said structural members.

5. The cryostat according to claim 4, wherein sound insulating means surround passages connected to said refrigerator means.

6. The cryostat according to claim 1, wherein said refrigerator means is fixed to a rigid member other than said cryostat, and wherein air-tight means couple said refrigerator means and said cryostat to each other.

7. The cryostat according to claim 1, wherein means for mounting said refrigerator means is mounted on a magnetic shield plate.

8. The cryostat according to claim 1, wherein said refrigerator means is fixed to another member having at least one of a large mass and a smaller characteristic frequency than a characteristic frequency of the cryostat.

9. A nuclear magnetic resonant apparatus using a cryostat with refrigerator means, said cryostat including liquid helium tank means containing a cylindrical superconductive coil therein, radiation shield means for surrounding said liquid helium tank means, vacuum container means for surrounding said radiation shield means, heat-insulating tank means for receiving a low temperature end portion of said refrigerator means for cooling said radiation shield means, wherein said refrigerator means is a compact helium refrigerator, said low temperature end portion of said refrigerator means includes a shaft forming a cooling medium generating portion, and wherein said shaft is positioned in a central portion in an axial direction of said cylindrical superconductive coil and on an outer cylinder of said vacuum container means located at an oblique angle of substantially 45 in a radial direction with respect to an installing surface of the nuclear magnetic resonant apparatus.

10. The apparatus according to claim 9, wherein rigid coupling means unitarily couple said refrigerator means with said vacuum container means and a part of a structural member of the apparatus other than said heat-insulating tank means.

11. The apparatus according to claim 10, wherein said structural member has at least one of a larger mass and a smaller characteristic frequency than a characteristic frequency of the cryostat, and wherein said refrigerator means is mounted on said structural member.

12. The apparatus according to claim 11, wherein said structural member is a magnetic shield plate.

13. The apparatus according to claim 9, wherein elastic support means couple said refrigerator means and an outer sleeve of said vacuum container means to each other.

14. The apparatus according to claim 9, wherein said refrigerator means is fixed to a rigid coupling means other than the cryostat, and wherein air-tight means couple said refrigerator means and said cryostat to each other.

15. A nuclear magnetic resonant imaging apparatus according to claim 9, further comprising a magnetic shield plate means having an octagonal cross-section for forming a structural member for coupling the refrigerator means to the apparatus.

* * * * *